(12) United States Patent
Pirillis

(10) Patent No.: US 8,335,088 B2
(45) Date of Patent: *Dec. 18, 2012

(54) LOCK MECHANISM FOR ELECTRONIC DEVICE

(75) Inventor: Alexandros Pirillis, Skokie, IL (US)

(73) Assignee: Methode Electronics, Inc., Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/072,486

(22) Filed: Mar. 25, 2011

(65) Prior Publication Data

US 2011/0211904 A1    Sep. 1, 2011

Related U.S. Application Data

(63) Continuation of application No. 12/079,511, filed on Mar. 27, 2008, now Pat. No. 8,040,687.

(51) Int. Cl.
*H05K 7/18*    (2006.01)
(52) U.S. Cl. .......................... 361/801; 361/803; 361/802
(58) Field of Classification Search .................. 361/755, 361/801–803, 749, 752, 800; 439/607, 372, 439/352; 385/92
See application file for complete search history.

(56) References Cited

U.S. PATENT DOCUMENTS

| | | | |
|---|---|---|---|
| 6,430,053 B1 | 8/2002 | Peterson et al. | |
| 6,439,918 B1 | 8/2002 | Togami et al. | |
| 6,533,603 B1 | 3/2003 | Togami | |
| 6,824,416 B2 * | 11/2004 | Di Mascio | 439/352 |
| 6,830,385 B2 * | 12/2004 | Ishigami et al. | 385/92 |
| 6,851,867 B2 | 2/2005 | Pang et al. | |
| 6,872,010 B1 | 3/2005 | Bianchini | |
| 6,884,097 B2 | 4/2005 | Ice | |
| 7,004,772 B1 | 2/2006 | Hsiao et al. | |
| 7,066,746 B1 | 6/2006 | Togami et al. | |
| 7,077,578 B2 | 7/2006 | Lee et al. | |
| 7,090,523 B2 | 8/2006 | Shirk et al. | |
| 7,101,093 B2 | 9/2006 | Hsiao et al. | |
| 7,175,470 B2 | 2/2007 | Kangas | |
| 7,186,134 B2 | 3/2007 | Togami et al. | |
| 7,201,520 B2 | 4/2007 | Mizue et al. | |
| 7,261,475 B2 | 8/2007 | Sasaki et al. | |
| 7,665,904 B2 | 2/2010 | Yu | |
| 2005/0170695 A1 * | 8/2005 | Togami et al. | 439/607 |
| 2005/0282425 A1 * | 12/2005 | Lloyd et al. | 439/372 |
| 2006/0078259 A1 | 4/2006 | Fuchs | |

* cited by examiner

*Primary Examiner* — Hung S Bui

(74) *Attorney, Agent, or Firm* — Arnstein & Lehr LLP

(57) ABSTRACT

A retractable locking mechanism comprising a lever having a handle end opposite a rotation end and a pivot point positioned between the handle end and the rotation end such that the lever pivots about an axis of rotation of the lever; a first cam positioned on the rotation end of the lever; an actuator with a front end and a back end, the front end attached to the pivot point of the lever; a lock disposed adjacent to the actuator and the lock having a first end and a second end and an axis of rotation of the lock and wherein pivoting the lever moves the actuator along a plane of the actuator to contact and rotate the lock in one of a locked state and an unlocked state.

27 Claims, 8 Drawing Sheets

# LOCK MECHANISM FOR ELECTRONIC DEVICE

CROSS REFERENCE TO RELATED APPLICATION

This application is a continuation of co-pending application Ser. No. 12/079,511, filed Mar. 27, 2008, and claims priority thereto.

The present invention pertains to a locking mechanism for an electronic device such as an electronic module mounted in a receptacle.

BACKGROUND OF THE INVENTION

Locking mechanisms can be utilized to secure a variety of modules or devices within cages. For example, an electronic module can be inserted and secured within a base device, such as a computer or an electronics rack. Yet the module is secured temporarily to prevent damage from handling and to ensure that electrical connections remain robust. The module must also be easily removed so that replacement modules can be inserted into the base device. In a typical example, the module contains a copper transceiver module which is connected to a router in the base. Transceiver component upgrades can become available more frequently than upgrades to the router, making it advantageous to both quickly remove and replace the transceiver without having to replace the entire router.

Often the carrier and base are compact structures and therefore require a compact locking mechanism. Extremely compact electronics require miniaturized locking devices.

The use of an actuating member to retract biased projections back into the carrier such that the carrier can be removed from the receptacle is known. However, these devices are often complex, expensive and fragile. Further, these devices can require additional force to retract the projections as they may get caught on the receptacle as they are retracted into the carrier.

SUMMARY OF THE INVENTION

Accordingly, embodiments of the invention are directed to a retractable locking mechanism for locking a module in a cage.

In an embodiment, the invention provides a retractable locking mechanism for locking a module in a cage using a lever and slider block assembly.

In another embodiment, the invention provides a retractable locking mechanism for locking a module in a cage using a lever and slider block assembly made of steel.

In yet another embodiment, the invention provides a retractable locking mechanism for locking a module in a cage that can be stored with a group of like modules in a manner that makes efficient use of space.

In yet another embodiment, the invention provides a retractable locking mechanism for locking a module in a cage with improved shielding of electromagnetic interference.

Additional features and advantages of embodiments of the invention will be set forth in the description which follows, and in part will be apparent from the description, or may be learned by practice of embodiments of the invention. The objectives and other advantages of the embodiments of the invention will be realized and attained by the structure particularly pointed out in the written description and claims hereof as well as the appended drawings.

To achieve these and other advantages and in accordance with the purpose of embodiments of the invention, as embodied and broadly described, the retractable locking mechanism for locking a module in a cage includes a retractable locking mechanism comprising: a lever having a handle end opposite a rotation end and a pivot point positioned between the handle end and the rotation end such that the lever pivots about an axis of rotation of the lever; a first cam positioned on the rotation end of the lever; an actuator with a front end and a back end, the front end attached to the pivot point of the lever; a lock disposed adjacent to the actuator and the lock having a first end and a second end and an axis of rotation of the lock; a second cam attached to the lock for bearing on the back end of the actuator; and wherein pivoting the lever moves the actuator along a plane of the actuator to contact and rotate the second cam such that the lock is disposed in one of a locked state and an unlocked state.

In another aspect, the retractable locking mechanism for locking a module in a cage includes a retractable locking mechanism comprising a module; a lever positioned on the module having a handle end opposite a rotation end and a pivot point positioned between the handle end and the rotation end such that the lever pivots about an axis of rotation of the lever; a first cam positioned on the rotation end of the lever; an actuator with a front end and a back end, the front end attached to the pivot point of the lever; a lock disposed adjacent to the actuator and the lock having a first end and a second end and an axis of rotation of the lock; and a second cam for bearing on the back end of the actuator.

In yet another aspect, the retractable locking mechanism for locking a module in a cage includes a module and cage assembly including a retractable locking mechanism comprising a module; a cage for receiving the module; a lever positioned on the module having a handle end opposite a rotation end and a pivot point positioned between the handle end and the rotation end such that the lever pivots about an axis of rotation of the lever; a first cam for contacting a surface of the cage and attached to the rotation end of the lever; an actuator with a front end and a back end, the front end attached to the pivot point of the lever; a lock disposed on the module and the lock having a first end and a second end and an axis of rotation of the lock; a second cam for bearing on the back end of the actuator attached to the lock; a protrusion on the lock that is substantially perpendicular to the axis of rotation of the lock; and a lock receptacle in the cage for receiving the protrusion of the lock.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the invention and are incorporated in and constitute a part of this specification, illustrate embodiments of the invention and together with the description serve to explain the principles of embodiments of the invention.

FIG. 2b and FIG. 2c show a side elevation view of the functioning of the cam of the lever of the module of FIG. 2a;

FIG. 5 shows a perspective, enlarged view of the receptacle of the cage of FIG. 2a;

DETAILED DESCRIPTION

Figure 1:
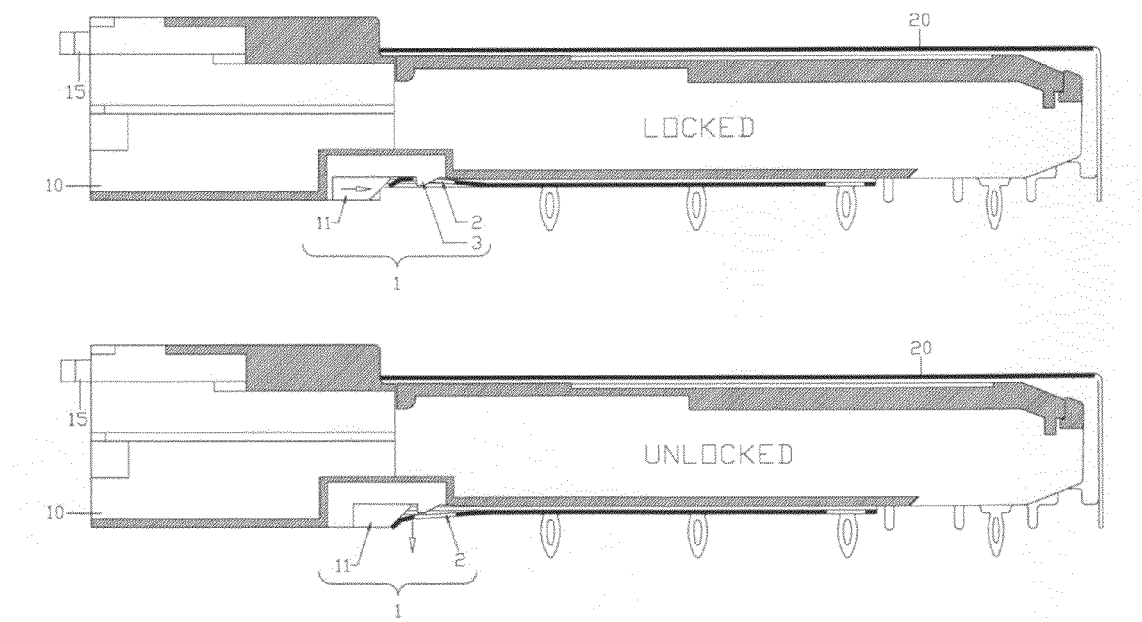
FIG. 1 shows a side elevation view of a module and cage assembly in the unlocked and locked configurations of a prior art locking mechanism.

Reference will now be made in detail to the preferred embodiments of the invention, examples of which are illustrated in the accompanying drawings. It will be apparent to those skilled in the art that various modifications and variations can be made in the embodiments of the invention, the computer assisted process for providing liquidity to an enterprise by utilizing intellectual property assets, without departing from the spirit or scope of the embodiments of the invention. Thus, it is intended that embodiments of the invention cover the modifications and variations of this invention provided within the scope of the appended claims and their equivalents. Like reference numerals in the drawings denote like elements.

FIG. 1 shows a side elevation view of a module and cage assembly in the unlocked and locked configurations of a prior art locking mechanism. The locking mechanism 1 secures the module 10 to the cage 20 so as to prevent damage to the module and/or electrical connections (not shown) when the module is inadvertently moved. The module 10 is placed into the locked configuration shown in FIG. 1 by placing the module 10 in the cage 20 and pushing on the module. The insertion of the module 10 into the cage temporarily displaces tab 2 just before it is fully inserted into cage 20. Once the module is fully inserted, the tab 2 goes back into its natural locked position and locks the module 10 into cage 20. The tab 2 is usually made of wire or a stamped piece of copper alloy. When the tab 2 is deflected in a manner so that it clears the stationary lock 3 of module 10 in order to disengage the tab 2 from the stationary lock 3 and the module may be removed from the cage.

Figure 2A:
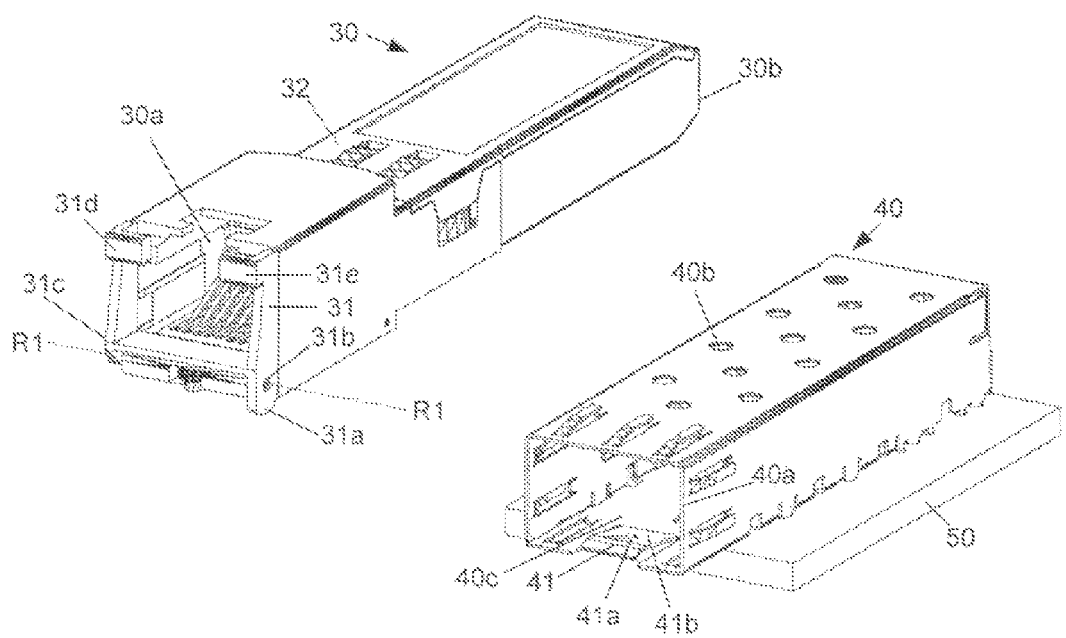
FIG. 2a shows a perspective, exploded view of the module of the present invention with a locking mechanism and removed from a cage.

FIG. 2a shows a perspective view of the module of the present invention with a locking mechanism and removed from a cage. The lever 31 is on the exterior of the module 30 such that when the module 30 is inserted into the cage 40, the lever 31 remains outside the cage 40. Alternatively, the lever 31 may be such that when the module 30 is inserted into the cage 40, part of the lever 31 is inside the cage 40. The lever 31 has a cam 31a and an axis of rotation R1. FIG. 2a shows a lever 31 with a single cam 31a. Alternatively, the lever 31c an have two or more cams. The lever 31 pivots about an axis of rotation R1 using pivot joints 31b and 31c. The lever 31 can be steel or it can contain one of number of other metals including aluminum. Alternatively, the lever 31 can be composed of one of a number of plastics. Although FIG. 2a shows a lever with two pivot joints, 31b and 31c, the lever 31 can have one, three or more pivot joints. The lever 31 can be C-shaped, as shown in FIG. 2a or it can have one of a number of other shapes including that of an L, a rod, a rectangle, a square or a rounded shape. As shown in FIG. 2a, the lever 31 has two handle components 31d and 31e. Alternatively, it can have one, three or more handle components.

The module 30 is typically composed of a metallic or a plastic material and can contain a printed circuit board or other type of electronics and components (not shown). The module 30 has openings at its ends 30a and 30b and can have additional openings (not shown) as needed to establish electrical connections or for facilitating mechanical stability. Alternatively, the module 30 can be completely sealed at one or more ends, 30a and 30b. Typically, there are electrical connections such as wires, sockets and/or plugs (not shown) at end 30b of the module 30. Alternatively, end 30b can be free of electrical connections.

As shown in FIG. 2a, the cage 40 can be mounted on a flat board 50. Alternatively, the cage 40 can be free-standing or can be mounted in one of a number of other fixtures such as an electronics rack, storage unit or shelf (not shown). The cage 40 has ventilation holes 40b, as shown in FIG. 2a. Alternatively, the case can be without holes. The cage 40 is typically composed of a hardened brass alloy, but can also include one or more of a number of metals. Alternatively, the cage 40 can be composed of metallized plastic. As shown in FIG. 2a, the cage 40 has a receptacle 41 for receiving the protrusion of the locking mechanism (not shown) of the module 30 for locking the module 30 to the cage 40. The receptacle 41 can be shaped like a tab, as shown in FIG. 2a, or have one of a number of other shapes including that of a diamond, triangle or rounded shape. The receptacle 41 has a hole 41a for accepting a lock (not shown) and locking the module 30 to the cage 40. The hole 41a may have a triangle shape, as shown in FIG. 2a, or have one of a number of other shapes including that of a square, rectangle, key hole or rounded shape. FIG. 2a shows the receptacle 41a as having a single engagement surface 41b for engaging the lock (not shown). The engagement surface 41a s depicted in FIG. 2a is raised and is skewed (not parallel) from the bottom surface 40c of the cage 40, as shown in FIG. 2a. Alternatively, the engagement surface 41 can be flush with or lower than the bottom surface 40c of the cage 40. The engagement surface 41 can alternatively be parallel to the bottom surface 40c of the cage 40. Further, although FIG. 2a shows a single engagement surface 41b and a single hole 41a, the receptacle 41 can contain multiple engagement surfaces and multiple holes.

Figure 2B:
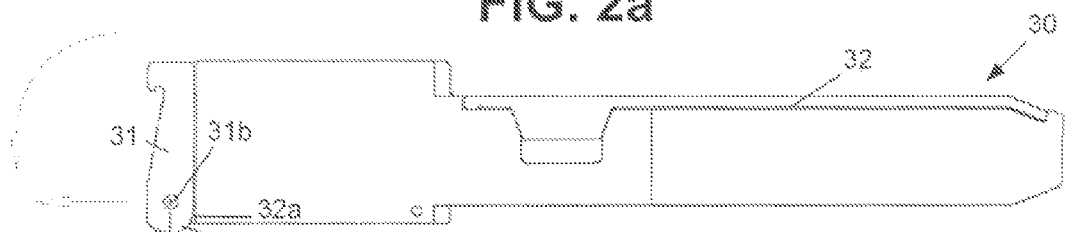

FIG. 2b shows a side elevation view of the functioning of the cam of the lever of the module of FIG. 2a. As shown in FIG. 2b, the cam 31a pushes off the engagement point 32a in order to move the lever 31 away from the module 30 by a distance D. Moving the lever 31 away from the module 30 disengages a locking mechanism that locks the module 30 to the cage 40 (as will be discussed below).

Figure 3:
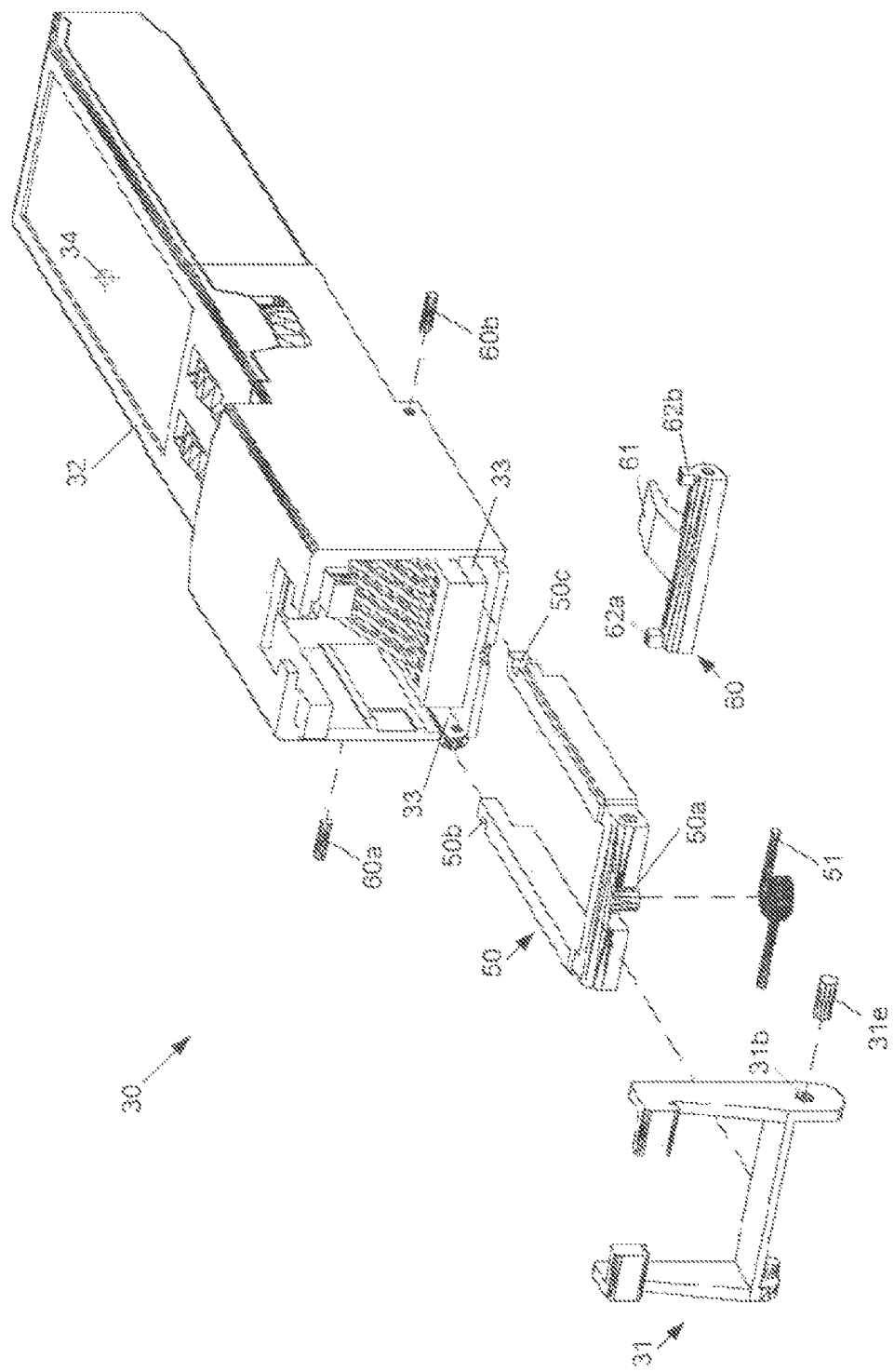
FIG. 3 is an enlarged, perspective, exploded view of the components of the locking mechanism and module.

FIG. 3 is an enlarged, exploded view of the components of the locking mechanism. As shown in FIG. 3, in an embodiment the lever 31 is bolted using rotatable bolt 31e onto the slider or actuator 50. The slider or actuator 50 is then inserted into tracks 33 on either side of the interior of the module 30. The slider or actuator 50 slides along the tracks 33 in the module 30. The slider or actuator 50 is typically composed of steel, but may be one or more of a number of metals. Alternatively, the slider or actuator 50 can be composed of plastic. The slider or actuator 50 can be C-shaped, as shown in FIG. 3 or it can have one of a number of other shapes including that of an L, a rod, a rectangle, a square or a rounded shape. The slider or actuator 50 contains a spring 51 mounted on the spring holder 50a that provides a restoring force to the slider. The spring 51 can be a wound spring, as shown in FIG. 3, or it can be a stamped spring (not shown). The spring 51 can be made of steel or, alternatively, can be composed of one or combinations of a number of other metals. In an embodiment, the spring is mounted on the slider or actuator 50 in such a way that the restoring force brings the slider towards the center 34 of the module 30. Alternatively, the spring 51 can be mounted on the slider or actuator 50 such that the restoring force brings the slider away from the center 34 of the module 30.

A lock 60 is mechanically coupled to the slider or actuator 50 via two cams 62a and 62b, as shown in FIG. 3. In an embodiment, the lock 60 is bolted onto the module 30 using rotatable bolts 60a and 60b such that the lock 60 may rotate when the slider or actuator 50 pushes on the cams 62a and 62b of the lock 60. Alternatively, the lock can be secured to the module using a 1 piece spring loaded pin (not shown)— "watch pin" style. The lock 60 is bolted onto the module 30. The slider or actuator 50, lock 60 and rotatable bolts 31d, 60a and 60b are all made of steel. Alternatively, the slider or actuator 50, lock 60 and rotatable bolts 31e, 60a and 60b can be made of plastic or from one of or a combination of other metals including aluminum.

Figure 2C:
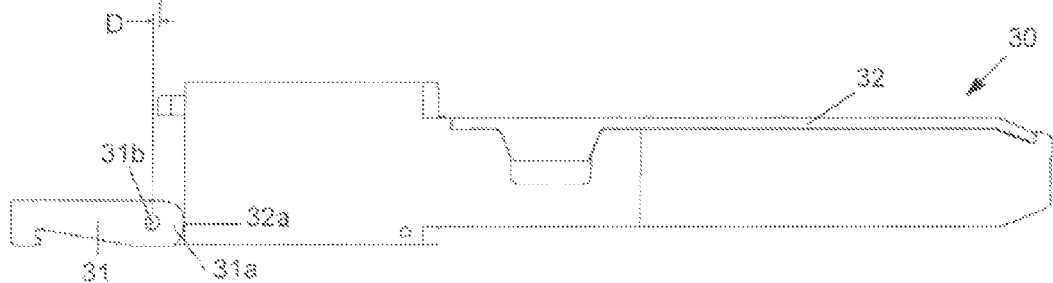
Figure 4A:
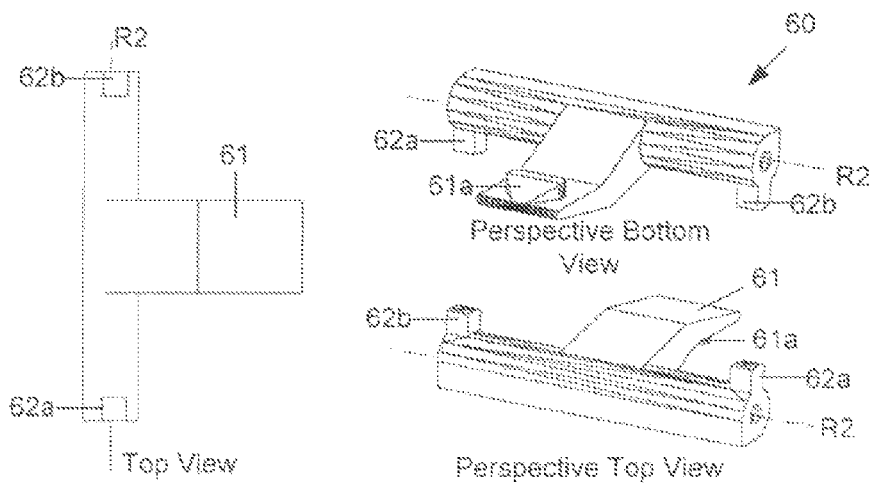
FIG. 4a shows an enlarged top, perspective bottom and perspective top view of the lock of FIG. 3.

FIG. 4a shows an enlarged top, perspective bottom and perspective top view of the lock of FIG. 3. As shown in FIG. 4a, the lock 60 has a protrusion or boss 61 for engaging a receptacle 41 (FIG. 2a) of the cage 40 in order to lock the module 30 to the cage 40. The protrusion or boss 61 can be shaped like a tab, as shown in FIG. 4a, or it can have one of a number of other shapes including a triangular, rectangular, square or rounded shape. As shown in FIG. 4a, the lock 60 has an axis of rotation R2 about which the lock 60 can be rotated to move the protrusion or boss 61 of the lock 60 up or down. The protrusion or boss 61 of the lock 60 has an inclined sliding surface or barb 61a that can be inserted into the 41a of the receptacle 41 of the cage 40 (FIG. 2a) for locking the device. The barb 61a can be pyramid-shaped, as shown in FIG. 4a, or it can have one of a number of other shapes including that of a triangular, rectangular, square prism or have a rounded shape. The protrusion 60 is shaped to fit the hole 41a (FIG. 2) of the receptacle 41. As shown in FIG. 4a, the lock 60 has two cams; 62a and 62b, along the axis of rotation R2 for rotating the lock 60. The cams 62a and 62b can be tab shaped, as shown in FIG. 4a, or they can have one of a number of other shapes including square, rounded and triangular. The lock 60 can have a two cams 62a and 62b, as shown in FIG. 4a, or the lock 60 can alternatively have one, three or more cams.

Figure 4B:
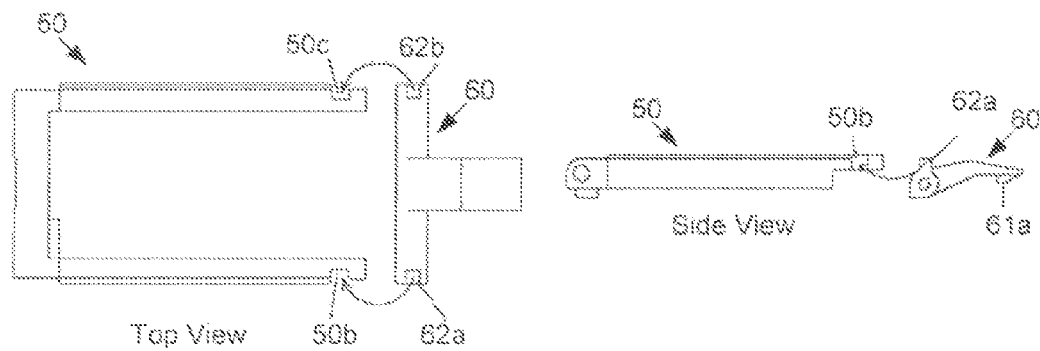
FIG. 4b shows an enlarged, exploded top and side view of assembling the lock to the slider of FIG. 3.
Figure 4C:
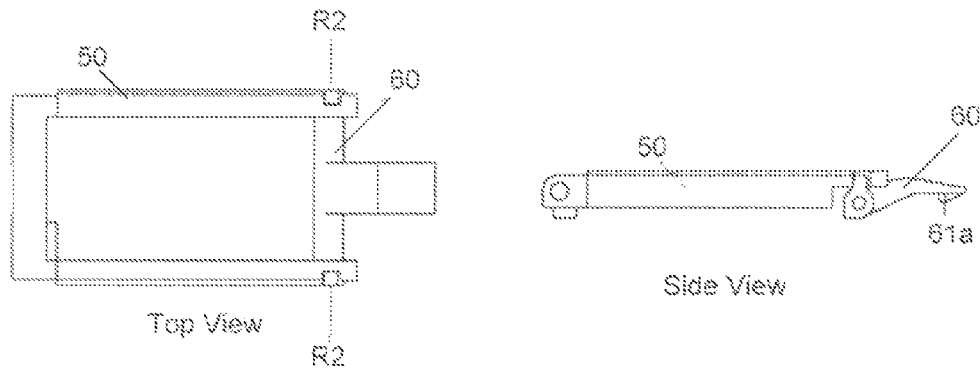
FIG. 4c shows an enlarged top and side view of the assembled lock and slider.

FIG. 4b shows an enlarged, exploded top and side view of assembling the lock to the slider of FIG. 3. As shown in FIG. 4b, the two cams 62a and 62b of the lock are placed in slots 50b and 50c of the slider or actuator 50, respectively. The cams 62a and 62b mechanically couple with the slots 50b and 50c of the slider or actuator 50 such that motion of the slider along the tracks 33 in the module 30 (FIG. 3) causes the slider to push or pull the two cams 62a and 62b and rotate the lock. FIG. 4c shows an enlarged top and side view of the assembled lock and slider.

Figure 5:
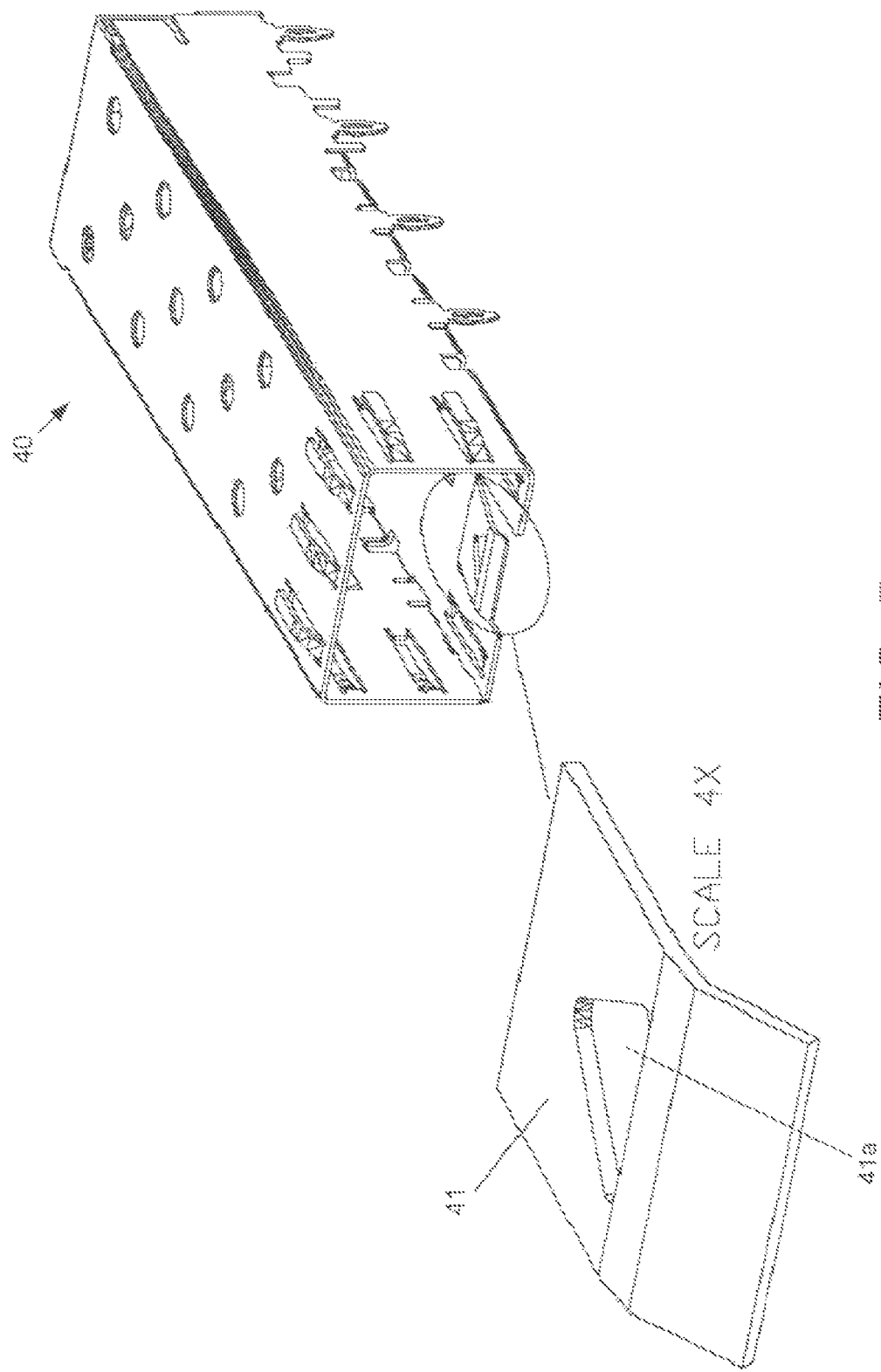

FIG. 5 shows a perspective close-up view of the receptacle 41 formed by a resilient metal tab of the cage of FIG. 2a. FIG. 5 shows a triangle shaped hole 41a on the receptacle 41 for accepting the pyramid shaped inclined sliding surface or barb 61a of the lock 60 shown in FIGS. 40a-c. Referring to FIG. 4a, rotating the lock 60 about the axis of rotation R2 (FIG. 4a) such that the protrusion or boss 61 (FIG. 4a) moves up causes the inclined sliding surface or barb 61a (FIG. 4a) to be removed from the hole 41a of the receptacle 41 thereby unlocking the module 30 from the cage 40. Rotating the lock 60 (FIG. 4a) about the axis of rotation R2 (FIG. 4a) such that the protrusion or boss 61 (FIG. 4a) moves down causes the inclined sliding surface or barb 61a (FIG. 4a) to enter the receptacle 41 (FIG. 5) of the cage 40 thereby locking the module 30 to the cage 40. Insertion of the inclined sliding surface or barb 61a (FIG. 4a) into the hole 41a of the receptacle 41 locks the module 30 to the cage 40. Removal of the inclined sliding surface or barb 61a from the hole 41a of the receptacle 41 unlocks the module 30 from the cage.

Figure 6:
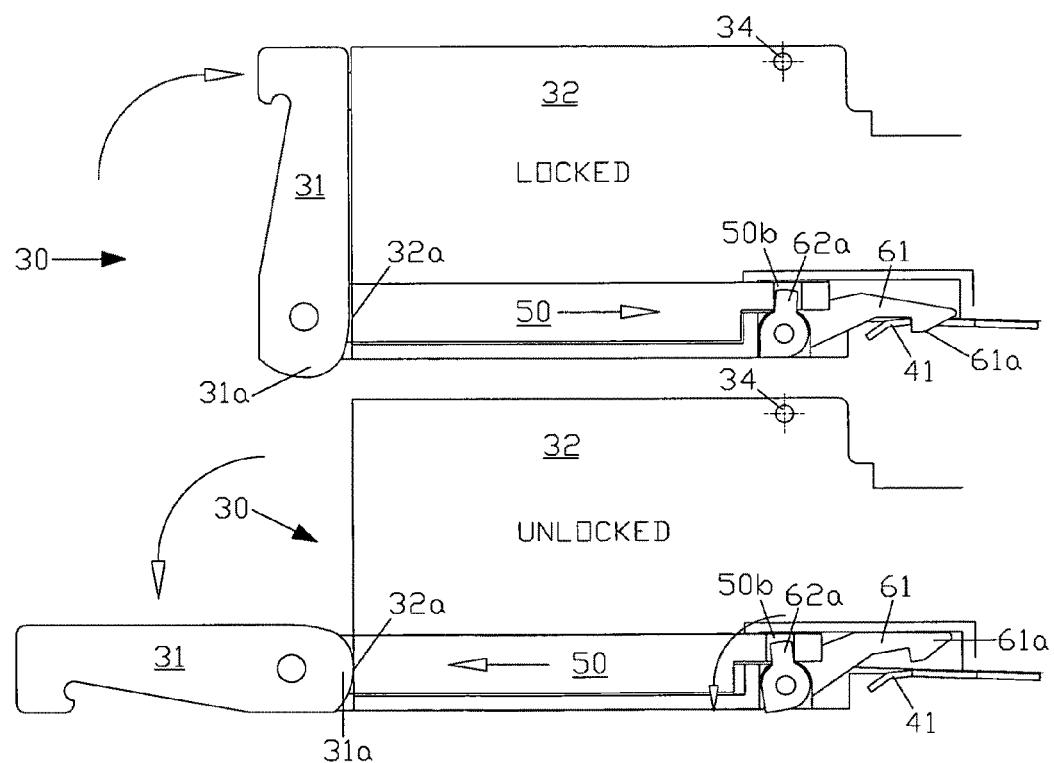
FIG. 6 shows side elevation, partial views of the unlocked and locked configurations of the lock and cage mechanism.
Figure 7:
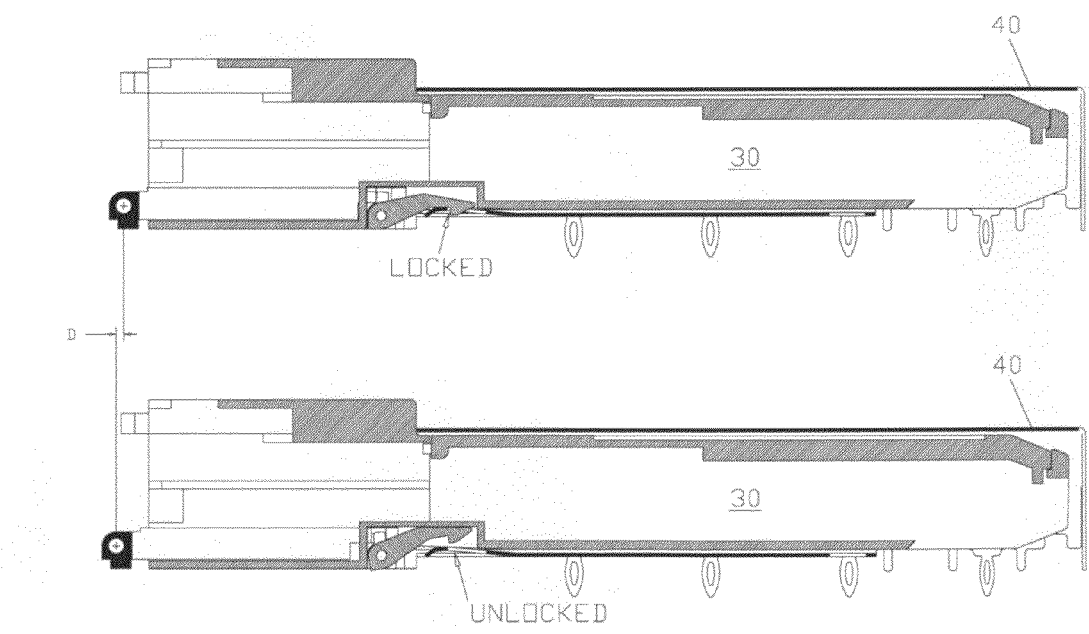
FIG. 7 shows a side elevation view of the module received in a cage in the unlocked and locked configurations.

FIG. 6 shows side elevation, partial views of the unlocked and locked configurations of the lock and cage mechanism. FIG. 7 shows a side elevation view of the module received in a cage in the unlocked and locked configurations. First the module 30 is placed within the cage 40 such that the lever 30 is in a vertical position (FIG. 2b). The cam 31a pushes off of edge 32a of the module 30. Edge 40a is a hard stop for the module entering the cage. The receptacle 41 on the cage 40 displaces itself to allow the barb 61a enter hole 41a of the receptacle 41. This action provides a clicking sound that ensures that the module is fully inserted. When the inclined sliding surface or barb 61a of the protrusion or boss 61 is within receptacle 41, the module 30 is locked to the cage 40 and is oriented in the locked configuration and cannot be removed until it is in the unlocked configuration. As shown in FIG. 7, the lock 60 is toggled from the unlocked to the locked state by moving the slider or actuator 50a distance D (see also FIGS. 2b and 2) closer to the center 34 of the module 30 while the module 30 remains stationary with respect to the cage 40.

Referring again to FIG. 6, the lock 60 is moved to the unlocked configuration from the locked configuration is as follows. The lever 31, in the vertical locked position, is rotated about its axis of rotation R1 (FIG. 2a) to the horizontal position in the FIG. 2c. The cam 31a engages the housing 32 at the engagement point 32a and pulls the slider or actuator 50 away from the center 34 of the module 30, as shown in the locked configuration shown in FIG. 6. The slider or actuator 50 then pulls on the cams 62a and 62b of the lock 60 to cause it to rotate about the lock's axis of rotation R2 (FIG. 4a) and such that the inclined sliding surface or barb 6a protrusion or boss 61 is removed from the hole 41a of receptacle 41 of the cage 40, as shown in the unlocked configuration in FIG. 6. Disengaging the protrusion or boss 61 from the receptacle 41 of the cage 40 removes the inclined sliding surface or barb 61a of the protrusion or boss 61 from the hole 41a of the receptacle 41 and places the lock 60 in the unlocked position which releases the module 30 from the cage 40. In the unlocked position, the module 30 can be removed from the cage by simply grabbing one or both of the handles, 31d and 31e (FIG. 2a), of the lever 31 and pulling the lever 31 away from the center 34 of the module 30. The module 30 then slides from the cage 40 and can be easily removed. As shown in FIG. 7, the lock 60 is toggled from the locked to the unlocked state by moving the slider or actuator 50a distance D further from the center 34 of the module 30 while the module 30 remains stationary with respect to the cage 40.

Several advantages of the invention will be apparent to those skilled in the art. First, the lock 60, the slider or actuator 50 and the lever 31 can all be fashioned from steel making them extremely robust. Further, the use of dual cams 62a and 62b on the lock 60 ensures that a the forces applied to the lock 60 during transition between the locked and unlocked states are balanced about the center of mass of the lock 60. This action, as opposed to one that relies on a single cam on one side of the lock, is less likely to lead to fatigue and breakage of the locking mechanism through repeated use. In addition, the construction of the lock 60, the slider or actuator 50 and the lever 31 allows openings in the bottom of the module 30 to be minimized. This, in turn, minimizes electromagnetic interference between the circuitry of like modules stacked in close proximity.

Figure 8:
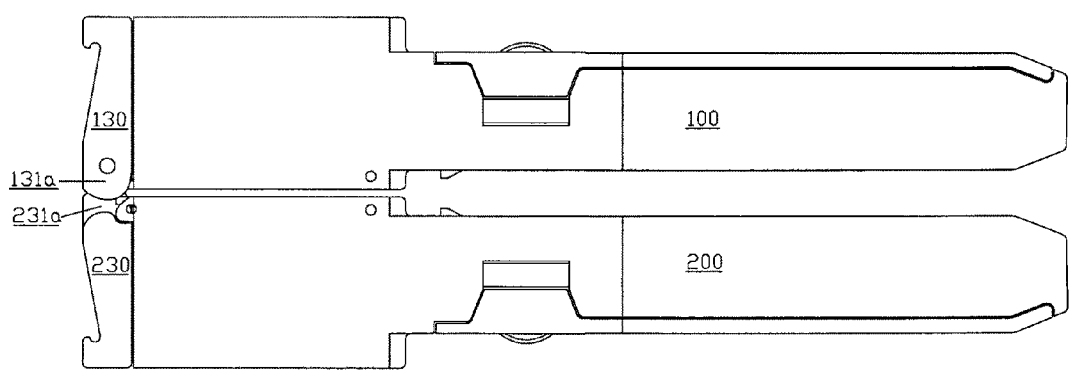
FIG. 8 shows a side elevation view depicting a belly to belly stacking technique for modules of the present invention that minimizes storage space.

FIG. 8 shows a side elevation view depicting a belly-to-belly stacking technique for modules of the present invention that minimizes storage space. In this configuration, a first module 100 can be stacked on top of a second module 200 provided that the modules are placed such that the cam 131*a* of the first module 100 is in a staggered configuration with the cam 231*a* of the second module 200. This allows for the use of a thin printed circuit board (not shown) or a thin cage (not shown) for storing and locking the modules 100 and 200. Multiple sets of such modules may be stacked together to form an electronics rack (not shown) or a device bank (not shown) that utilizes far less space than it would if the modules 100 and 200 were stacked such that the cams 131*a* and 231*a* were not staggered. Saving space is essential for most applications because more efficient use of space allows the addition of components and functionality. Also, cooling protocols can be made more efficient when electronic devices are placed in closer proximity leading to decreased cost and servicing.

It will be apparent to those skilled in the art that various modifications and variations can be made in locking mechanism of alternate embodiments of the of invention without departing from the spirit or scope of the invention. Thus, it is intended that embodiments of the invention cover the modifications and variations of this invention provided within the scope of the appended claims and their equivalents.

I claim:

1. A locking mechanism comprising:
a lever having a handle end opposite a rotation end and a pivot point such that the lever pivots about a first axis of rotation of the lever at the pivot point; the lever having first and second side arms joined by a base at the rotation end of the lever;
a first cam disposed at the rotation end of the lever;
an actuator having a front end and a back end, the front end engages the rotation end of the lever;
a lock disposed adjacent to the actuator and the lock having a second axis of rotation; and
wherein pivoting the lever moves the actuator to contact and rotate the lock such that the lock is capable of being disposed in one of a locked state and an unlocked state.

2. The locking mechanism according to claim 1, further comprising a module having a top surface and bottom surface and the locking mechanism disposed on the module and a spring member disposed at the bottom surface such that the spring member provides a force for returning the lock to the locked state.

3. The locking mechanism according to claim 1, wherein the lever is generally C-shaped a formed by the first and second side arms joined by the base at the rotation end of the lever and the first cam disposed at the rotation end of the first arm.

4. The locking mechanism according to claim 1, wherein the rotation end of the lever is attached to the actuator at the pivot point.

5. The locking mechanism according to claim 1, further comprising a second cam protruding from at least one of a first end of the lock and the back end of the actuator.

6. The locking mechanism according to claim 5, further comprising a cam body forming a second end of the lock for bearing on the back end of the actuator such that pivoting the lever moves the actuator to contact and rotate the cam body.

7. The locking mechanism according to claim 1, further providing a second and third cam disposed at a first and second end of the lock, respectively, along the axis of rotation of the lock.

8. The locking mechanism according to claim 1, wherein the lever is pivotally mounted to a module.

9. The locking mechanism according to claim 1, further comprising a module including a first end and pivoting of the lever causes the actuator to slide as a result of the first cam abutting the first end of the module when the lever is pivoted.

10. The locking mechanism according to claim 1, wherein the locked position includes a portion of the lock being mated within a lock receptacle in a cage.

11. The locking mechanism according to claim 1, wherein the first axis of rotation of the lever and the second axis of rotation of the lock are substantially parallel.

12. The locking mechanism according to claim 1, further comprising a module housing having a first end defining an opening, the module housing having a top surface and a bottom surface and a barb disposed at the bottom surface, the barb adapted to mate the module to a receptacle and a plane in which the actuator is movable and the plane includes the bottom surface and the second axis of rotation of the lock.

13. The locking mechanism according to claim 1, wherein the lock, lever and actuator are steel.

14. The locking mechanism according to claim 1, wherein the lock and actuator are separate components.

15. A module and locking mechanism comprising:
a module having an opening at a first end for receiving a plug;
a lever having a handle end opposite a rotation end and a pivot point positioned adjacent the rotation end such that the lever pivots about an axis of rotation of the pivot point, the lever disposed on the module;
a first cam disposed at the rotation end of the lever;
an actuator having a front end and a back end, the front end engaging the lever, the actuator sliding from a first position to a second position as a result of the lever being rotated; and
a lock disposed adjacent to the actuator and the lock engagable and disengageable from a locked state as a result of the actuator's orientation in one of the first and second position and the lock includes an axis of rotation and a spring member provides a force for pivoting the lock and returning the lock to the locked state.

16. The locking mechanism according to claim 15, wherein a spring member is disposed at a bottom surface of the module and provides a force for pivoting the lock along the axis of rotation in order to return the lock to the locked state.

17. The locking mechanism according to claim 16, wherein the spring member is a metal coil.

18. The locking mechanism according to claim 16, wherein the spring member is disposed on the actuator.

19. The locking mechanism according to claim 15, wherein a first length between the first earn and the pivot point is shorter than a second length between the handle end and the pivot point.

20. The locking mechanism according to claim 15, wherein the lock includes a second cam located on a first end of the lock.

21. The locking mechanism according to claim 20, wherein the second cam for bearing on the back end of the actuator such that pivoting the lever causes the actuator to slidingly move to contact and rotate the second cam.

22. The locking mechanism according to claim 21, wherein the actuator includes a slot at its first end for receiving the second cam such that pivoting the lever moves the actuator which rotates the lock via the second cam.

23. The locking mechanism according to claim 15, wherein the front end of the actuator is pivotally attached to the rotation end of the lever and the first cam configured to abut the first end of the module at an engagement point disposed apart from the front end of the actuator in order that the rotation of the lever downward causes the front end of the actuator to be pulled outward from the opening of the module from the first position to the second position as a result of the first cam abutting the engagement point.

24. The locking mechanism according to claim 15, wherein the front end of the actuator is pivotally attached to the lever at the axis of rotation of the lever.

25. The locking mechanism according to claim 15, wherein the first end of the module includes a front face surrounding the opening and the first cam abuts the front face of the first end of the module.

26. An unlocking mechanism comprising:
  a module housing having a first end defining an opening, the module housing having a top surface and a bottom surface and a barb disposed at the bottom surface, the barb capable of mating the module to a receptacle;
  a lever disposed at the first end of the module, the lever having a handle end opposite a rotation end and a pivot point such that the lever pivots about a first axis of rotation of the lever at the pivot point, the first axis of rotation adjacent to the bottom surface of the module housing and adjacent to the opening;
  a first cam disposed at the rotation end of the lever;
  an actuator having a front end and a back end, the front end engages the rotation end of the lever;
  a lock disposed adjacent to the back end of the actuator and the lock having a second axis of rotation; and
  wherein pivoting the lever about the first axis of rotation to cause the rotation end of the lever to have a rotational movement about the first axis of rotation and the rotational movement imparting rotational movement to the first cam in order to cause the actuator to contact and rotate the lock about the second axis of rotation such that the lock is capable of being disposed in-one of a locked state and an unlocked state.

27. The unlocking mechanism of claim 26 wherein the lever is attached to the front end of the actuator at the pivot point and the first cam engages the module housing adjacent the opening in order to cause the actuator to slide so that the back end of the actuator in turn rotates the lock around the second axis of rotation between the locked and unlocked state.

* * * * *